(12) United States Patent
Shuto et al.

(10) Patent No.: US 7,377,030 B2
(45) Date of Patent: *May 27, 2008

(54) WIRING BOARD MANUFACTURING METHOD

(75) Inventors: Takashi Shuto, Kawasaki (JP); Kenji Takano, Kawasaki (JP); Kenji Ilda, Kawasaki (JP); Kenichiro Abe, Kawasaki (JP); Keiji Arai, Kawasaki (JP); Kiyotaka Seyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 130 days.

This patent is subject to a terminal disclaimer.

(21) Appl. No.: 11/266,480

(22) Filed: Nov. 4, 2005

(65) Prior Publication Data
US 2006/0112544 A1    Jun. 1, 2006

Related U.S. Application Data

(63) Continuation of application No. PCT/JP03/06492, filed on May 23, 2003.

(51) Int. Cl.
*H05K 3/36* (2006.01)

(52) U.S. Cl. .................... 29/830; 29/825; 29/832; 29/846

(58) Field of Classification Search .............. 29/825, 29/830, 832, 833, 846
See application file for complete search history.

(56) References Cited

U.S. PATENT DOCUMENTS 7,152,314 B2 * 12/2006 Shuto et al. .................. 29/830

FOREIGN PATENT DOCUMENTS

| JP | 2-65198    | 3/1990 |
| JP | 3-82193    | 4/1991 |
| JP | 7-106769   | 4/1995 |
| JP | 2001-26747 | 9/2001 |
| JP | 2002-185139 | 6/2002 |

* cited by examiner

*Primary Examiner*—Carl J. Arbes
(74) *Attorney, Agent, or Firm*—Westerman, Hattori, Daniels & Adrian, LLP.

(57) ABSTRACT

The present invention relates to a method of manufacturing a wiring board comprising: a build-up layer, in which wiring patterns are piled with insulating layers; and a core substrate, which is separately formed from the build-up layer, the method comprising the steps of: separably forming the build-up layer on a plate-shaped support; electrically connecting the core substrate to the wiring patterns of the build-up layer on the support; and removing the support from the build-up layer so as to form the wiring board, in which the build-up layer is connected to the core substrate. By separably forming the build-up layer and the core substrate, the wiring board effectively exhibiting characteristics thereof can be produced.

6 Claims, 12 Drawing Sheets

WIRING BOARD MANUFACTURING METHOD

This application is a continuation of international application PCT/JP/2003/006492, filed on May 23, 2003.

FIELD OF TECHNOLOGY

The present invention relates to a wiring board manufacturing method, more precisely relates to a method of manufacturing a wiring board having high wiring density, low thermal expansion coefficient and high rigidity.

BACKGROUND OF TECHNOLOGY

A conventional wiring board manufacturing method, in which wiring patterns are formed on both sides of a core substrate by a build-up process, is shown in FIGS. 12 and 13.

A process of producing the core substrate 22, in which the wiring patterns are formed on the both sides, is shown in FIG. 12. A base board 10, in which copper films are adhered on both sides, is shown in FIG. 12A. The base board 10 is formed by adhering copper films 11 on the both side faces of a board member 10a, which is made of epoxy resin including glass cloth. In FIG. 12B, through-holes 12 are bored in the base board 10 by a drill. In FIG. 12C, inner faces of the through-holes are plated (with copper) so as to electrically connect wiring patterns, which will be formed on the both sides of the base board 10. The copper layers 14 are plated on the inner faces of the through-holes.

In FIG. 12D, the through-holes 12 are filled with resin fillers 16. In FIG. 12E, the side faces of the base board 10 are covered with copper by plating. With this structure, the both side faces of the base board 10 incuding end faces of the resin fillers 16 are entirely covered with copper layers 18. In FIG. 12F, wiring patterns 20 are formed by etching the copper layers 14 and 18 and the copper films 11 of the base board 10, so that the core substrate 22 can be produced.

A process of layering the wiring patterns on the both sides of the core substrate 22 is shown in FIG. 13. In FIG. 13A, wiring patterns 24 are formed on the both side faces of the core substrate 24 by the build-up process. Symbols 26 stand for insulating layers, and symbols 28 stand for vias for electrically connecting wiring patterns 24 in different layers. In FIG. 13B, photosensitive solder resists 30 are applied on surfaces of the build-up layers, and they are exposed and developed. In FIG. 13C, surfaces of the wiring patterns 24 are electroless-plated with nickel and gold, and exposed parts of the wiring patterns 24 are protected by plated layers 32. In FIG. 13D, solder bumps 34 are formed on electrodes of the wiring patterns 24, and the wiring patterns 24 are layered on the both sides of the core substrate 22, so that a wiring board 36 can be produced.

Since the base board 10 of the core substrate 36 is made of tough resin including glass cloth, the core substrate has high rigidity. However, in the conventional wiring board manufacturing method, in which the wiring patterns 24 are layered on the core substrate 22, which acts as a support, by the build-up process, distances between the through-holes 12 of the core substrate 22 cannot be shorter than a prescribed distance, so that wiring density cannot be high.

Electric characteristics of wiring boards can be improved by reducing thickness thereof, so thin wiring boards are required. However, if the core substrate is made thin, a special conveying mechanism is required, and rigidity of the wiring board is lowered so that the wiring board will be shrunk or waved due to stress caused in the steps of forming insulating layers, wiring patterns, etc. and wiring density cannot be high. Further, if the core substrate is made thin, a difference of thermal expansion coefficients between the wiring board and a semiconductor chip is made great, so that thermal stress therebetween must be great. To approximate the thermal expansion coefficient of the wiring board to that of the semiconductor chip, a metal core substrate, whose thermal expansion coefficient is low and nearly equal to that of the semiconductor chip, was used, but thermal stress between the core substrate and the build-up layers makes cracks in the build-up layers.

Thus, the present invention has invented to solve the above described problems, and an object of the present invention is to provide a wiring board manufacturing method, which is capable of forming wiring patterns with high density so as to correspond to highly integrated semiconductor chips, restraining thermal expansion of the wiring board, and increasing rigidity of the wiring board so as to restrain and resist thermal stress between the wiring board and semiconductor chips.

DISCLOSURE OF THE INVENTION

In the present invention, the method of manufacturing a wiring board comprising: a build-up layer, in which wiring patterns are piled with insulating layers; and a core substrate, which is separately formed from the build-up layer, comprises the steps of: separably forming the build-up layer on a plate-shaped support; electrically connecting the core substrate to the wiring patterns of the build-up layer on the support; and removing the support from the build-up layer so as to form the wiring board, in which the build-up layer is connected to the core substrate.

Since the build-up layer and the core substrate are separately formed, the build-up layer is not limited by size, etc. of through-holes bored in the core substrate so that the wiring patterns can be formed with high density. Rigidity of the core substrate can be increased by selecting a material and a producing process. By effectively taking advantageous characteristics of the build-up layer and the core substrate, the wiring board having high wiring density, low thermal expansion coefficient and high rigidity can be produced.

In another method of manufacturing a wiring board, in which build-up layers are formed on both sides of a core substrate, metal films, whose thermal expansion coefficients are lower than that of copper, are included in the build-up layers and located at positions not interfering with wiring patterns. With this method, the metal films having low thermal expansion coefficients are included in the build-up layers, so that a thermal expansion coefficient of the wiring board can be made lower and thermal stress between the wiring board and semiconductor chips can be restrained.

PREFERRED EMBODIMENTS OF THE INVENTION

Embodiment 1

Figure 1A:
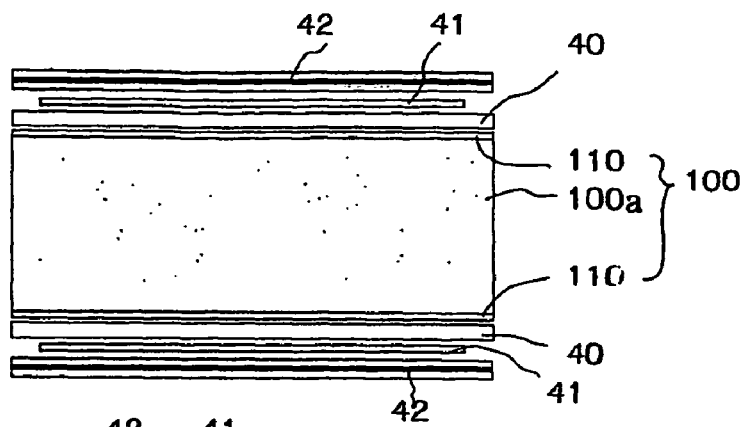
FIGS. 1A-D are explanation views of a step of forming build-up layers on both sides of a support.

FIGS. 1-4 shows the wiring board manufacturing method of the present invention. FIG. 1A shows a characteristic step of the method, wherein a first metal layer 41 and a second metal layer 42 are respectively adhered on both side faces of a support 100 by adhesive films 40.

The support 100 is used as a base, on which wiring patterns are formed by the build-up process, and made of a material having enough rigidity so as not to deform while forming build-up layers. In the present embodiment, a base member 100a of the support 100 is an epoxy resin plate, which includes glass cloth and whose thickness is 0.3-0.4 mm, and both side faces of the support 100 is covered with copper films 11, whose thickness are 9 μm. The support 100 is a large plate, in which a plurality of wiring boards can be formed.

One of the adhesive films 40 adheres and fixes the first metal layer 41 on the support 100; the other film adheres an outer edge part of the second metal layer 42 on the support 100. Thus, the adhesive films 40 entirely cover the both side faces of the support 100, and sizes of the first metal layer 41 and the second metal layers 42 are designed to locate an outer edge of the first metal layer 41 slightly inside of an outer edge of the second metal layer 42.

In the present embodiment, the first metal layer 41 is a copper film having thickness of 18 μm; the second metal layer 42 is constituted by copper films having thickness of 18 μm and an intermediate barrier layer, which is provided between the copper films and made of a metal, e.g., Cr, Ti, Ni, which is not etched by a solution for etching copper.

Figure 1B:
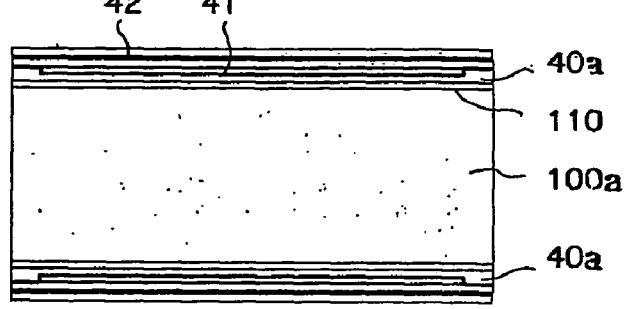

In FIG. 1B, the first metal layer 41 and the second metal layer 42 are respectively vacuum-themopressed onto the side faces of the support 100 with the adhesive films 40. In the process of the vacuum thermopress, as shown in FIG. 1A, the first metal layer 41 and the second metal layer 42 are piled on the adhesive films 40, heated and pressed with vacuum-sucking an entire work piece. By performing the vacuum thermopress, the first metal layer 41 is adhered onto a surface of the copper film 11 by an adhesive layer 40a; the outer edge part of the second metal layer 42 is adhered to the copper film 110 by an adhesive layer 40a. At that time, the first metal layer 41 and the second metal layer 42 are mutually vacuum-sucked. If the vacuum state between the first metal layer 41 and the second metal layer 42 is broken, the first metal layer 41 and the second metal layer 42 are mutually separated.

Figure 1C:
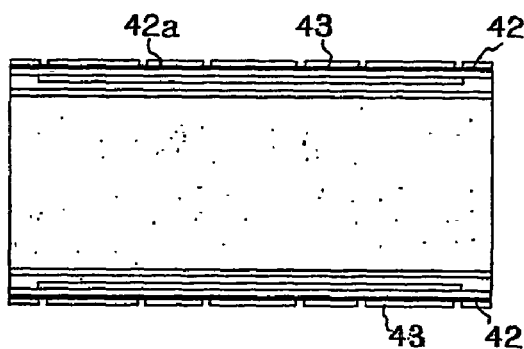

In FIG. 1C, wiring patterns 43 are formed by etching the outer copper film of the second metal layer 42. Since the second metal layer 42 has the intermediate barrier layer 42a made of the metal not etched by the solution for etching copper, the wiring patterns 42 can be easily formed by etching the copper film with a subtract process.

Figure 1D:
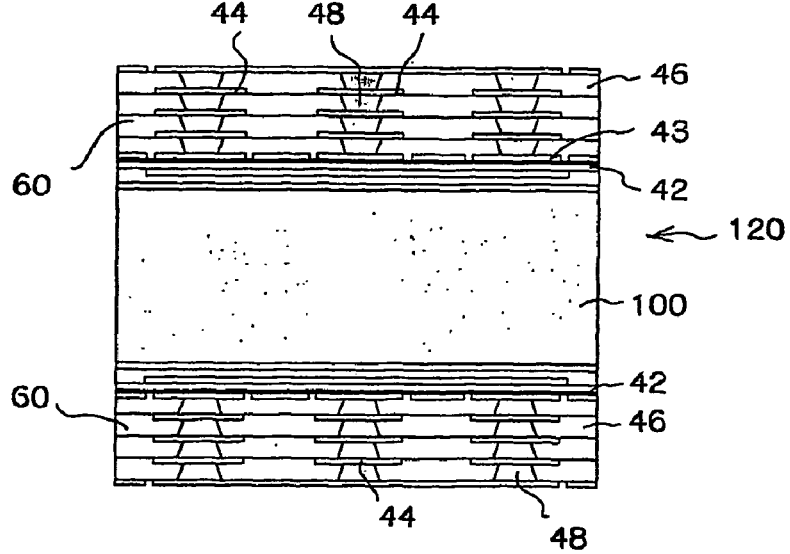

In FIG. 1D, wiring patterns 44 are further formed on the both sides of the support 100, on which the wiring patterns 43 have been formed, by the build-up process. Symbols 46 stand for insulating layers; symbols 48 stand for vias. In the present embodiment, the vias 48 are filled vias, and the pillar-shaped vias 48 are vertically connected.

FIG. 2 shows the steps of respectively connecting the core substrates 22, which are formed by the steps shown in FIG. 12, to both side faces of a layered body 120, in which build-up layers 60 are formed on the both side faces of the support 100. As described above, the through-holes are bored in the core substrate 22 by drill means, the inner faces of the through-holes are plated, and the wiring patterns 20 are formed in the both side faces of the base board 10.

Prepregs 50 are used for connecting the core substrates 22 to the both side faces of the layered body 120. The prepregs 50 has holes for accommodating electrically conductive paste 52, which is used for electrically connecting the core substrates 22 to the build-up layers 60, and the paste 52 is filled in the accommodating holes. Note that, adhesive film, which is made of thermoplastic resin, etc., may be used instead of the prepregs 50, further other electric conductive materials, e.g., solder, may be used instead of the conductive paste 52.

Figure 2A:
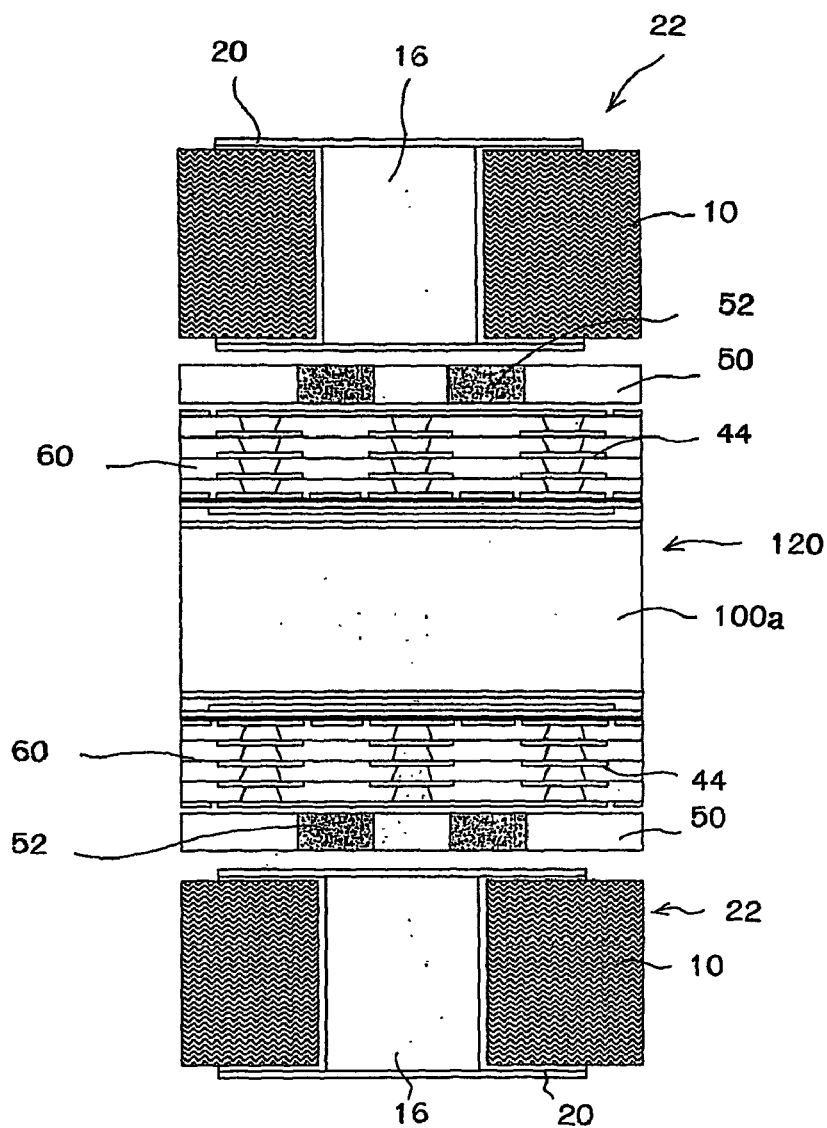
FIGS. 2A and B are explanation views of a step of connecting a layered body, which is constituted by the support and the build-up layers, to a core substrate.
Figure 2B:
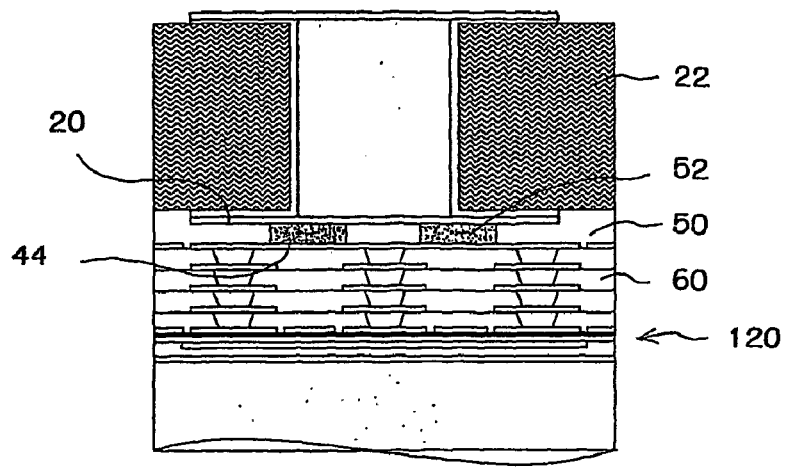

The prepregs 50 and the core substrates 22 are correctly positioned on the both side faces of the layered body 120 (FIG. 2A), and the core substrates 22 are connected to the layered body 120 by the prepregs 50 (FIG. 2B). With this structure, wiring patterns 44 of the layered body 120 and wiring patterns 20 of the core substrates 22 can be electrically connected by the paste 52.

FIG. 3 shows the steps of separating a base board 130, in which the build-up layers 60 are formed on one side face of the core substrate 22, from the connected body of the layered body 120 and the core substrates 22. The connected body of the layered body 120 and the core substrates 22 is shown in FIG. 3A, an outer edge part of the support 100, which is a core part of the layered body 120, cut, and the core substrate 22 and the build-up layers 60 are separated from the layered body 120. By cutting the connected body along a line located slightly inside of the outer edge of the first metal layer 41, the vacuum state between the first metal layer 41 and the second metal layer 42 is broken so that the first metal layer 41 and the second metal layer 42 can be easily separated. Since the build-up layers 60 are connected to the core substrate 22 by prepregs 50, the base board 130, in which the build-up layers 60 are integrated with the core substrate 22, can be produced as shown in FIG. 3B.

Figure 3A:
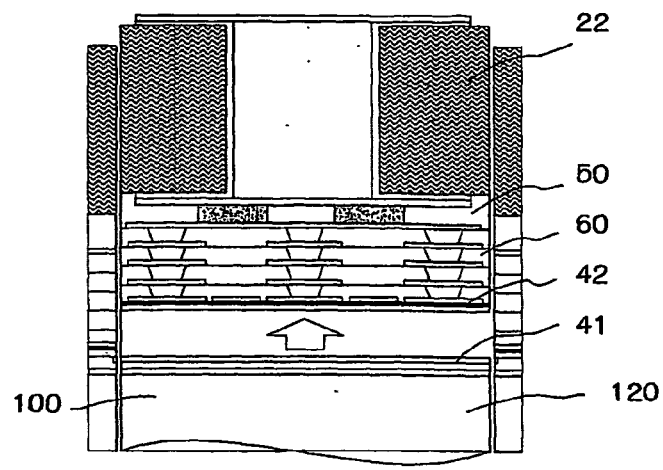
FIGS. 3A-D are explanation views of a step of separating a connected body constituted by the core substrate and the build-up layers from the layered body.
Figure 3B:
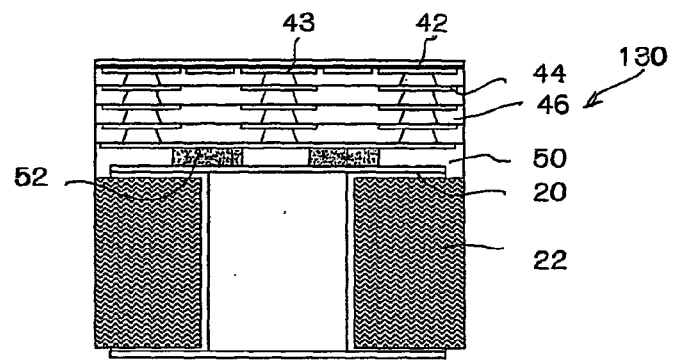
Figure 3C:
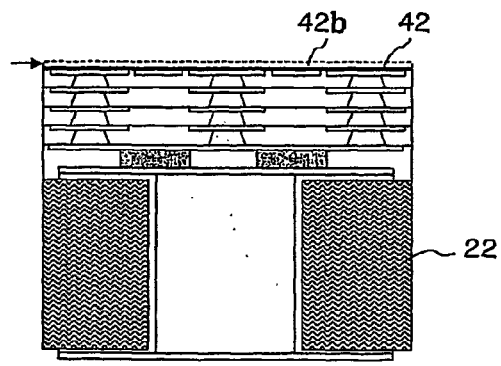
Figure 3D:
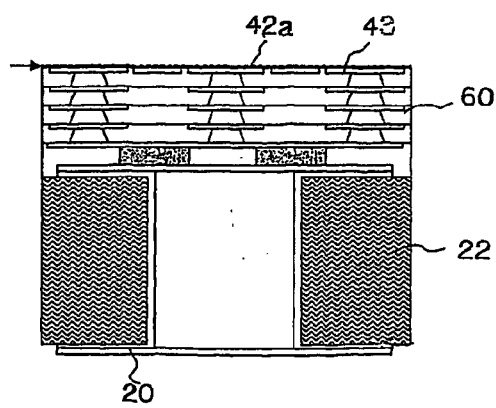

Next, the copper film 42b of the second metal layer 42, which is exposed in a surface of the base board 130, is removed by etching (FIG. 3C), further the exposed intermediate barrier layer 42a is also removed by removing the copper film 42b (FIG. 3D). Since the intermediate barrier layer 42a is made of the metal which is not etched in the solution for etching copper, the copper film 42b or the intermediate barrier layer 42a can be selectively removed by etching.

Figure 4A:
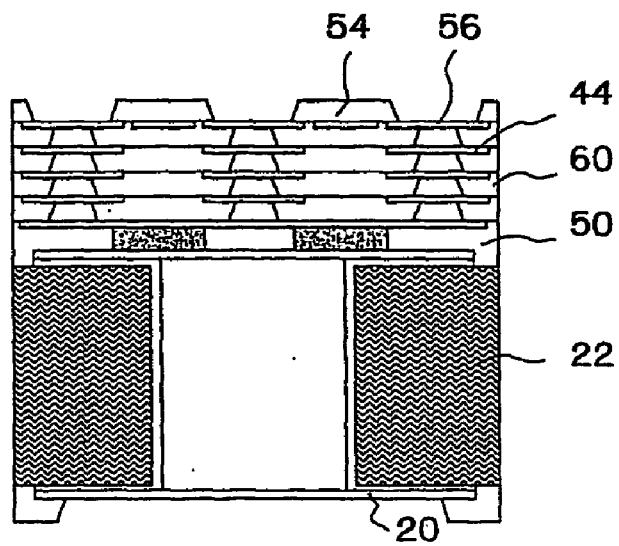
FIGS. 4A-C are explanation views of a step of forming a wiring board constituted by the core substrate and the build-up layers.
Figure 4B:
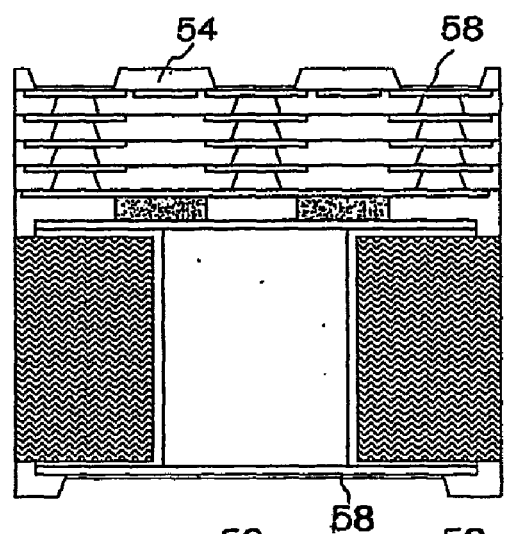
Figure 4C:
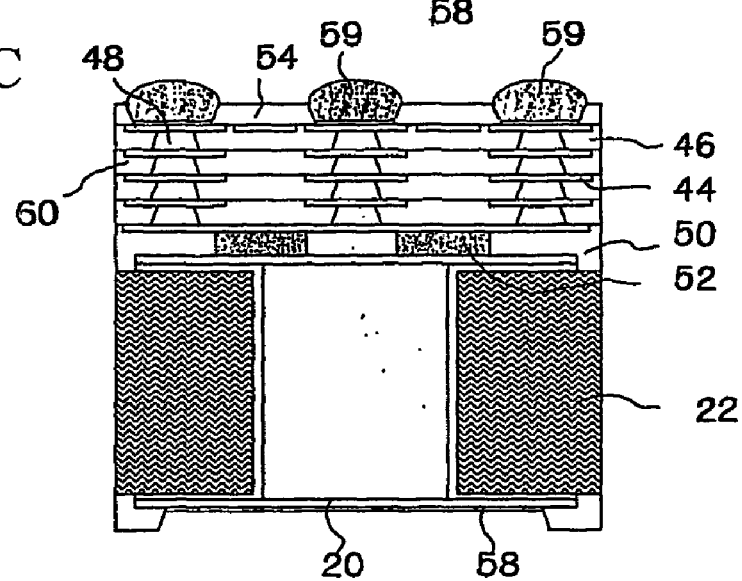

FIG. 4 shows the steps of completing the wiring board, in which electrodes are formed on an outer face of the build-up layers 60 integrated with the core substrate 22. In FIG. 4A, photosensitive solder resist 54 is applied on the outer face of the build-up layers 60, exposed and developed so as to form lands 56, on which the electrodes will be formed, and the wiring patterns 20, which are formed in a bottom face of the core substrate 22, are exposed. In FIG. 4B, the lands 56 and the wiring patterns 20 formed in the bottom face of the core substrate 22 are protected by protection layers 58, which are electroless-plated with nickel and gold; in FIG. 4C, solder bumps 59, which act as electrodes, are formed on the lands 56 by solder-printing and solder reflow.

The base board shown in FIG. 4C is a large board, so a plurality of the wiring boards can be gained by cutting the large base board.

In the present embodiment, the build-up layers 60, which are wiring layers of the wiring board, and the core substrate 22, which is a core of the wiring board, are separately fabricated, and the build-up layers 60 and the core substrate 22 are integrated in the following step so that the wiring board can be produced. By separately fabricating the build-up layers 60 and the core substrate 22, the wiring patterns 44 can be formed without restrictions of the core substrate 22 when the build-up layers 60 are formed; the wiring patterns 44 can be formed with high wiring density by the build-up process. A material and thickness of the core substrate 22 may be selected on the basis of required rigidity. Namely, by the method of the present embodiment, the wiring board having high wiring density and high rigidity for mounting semiconductor chips can be securely manufactured.

Note that, in the present embodiment, the through-holes and the wiring patterns 20 are formed in the core substrate 22, but the core substrate 22 may have no through-holes and no wiring patterns. Therefore, electric conductive means, e.g., the conductive paste 52, need not be provided in the prepregs 50.

Figure 5:
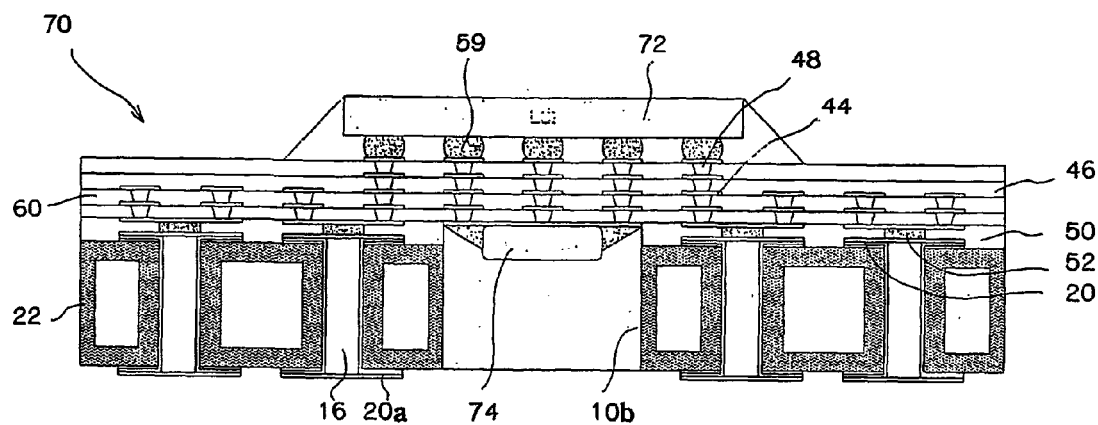
FIG. 5 is a sectional view of a semiconductor device, in which a semiconductor chip is mounted on the wiring board.

A semiconductor device, in which a semiconductor chip 72 is mounted on a wiring board 70 produced by the method of the present embodiment, is shown in FIG. 5. In the semiconductor device, the core substrate 22 has an element hole 10b, which corresponds to a mounting position of the semiconductor chip 72, and a circuit element 74 is provided on the lower side of the semiconductor chip 72. By forming the element hole 10b in the core substrate 22, the circuit element 74, e.g., capacitor, can be electrically connected to the semiconductor chip 72 via the build-up layers 60 only, so that a part of the wiring board including the element hole 10b can be substantially made thin, lengths of wires connecting the circuit element 74 to the semiconductor chip 72 can be shorter and high-frequency properties of the semiconductor device can be improved.

Embodiment 2

In the present embodiment, the core substrate 10 is produced by the conventional method shown in FIG. 12, then a metal film, which has a low thermal expansion coefficient, is included in build-up layer, so that a thermal expansion coefficient of the wiring board can be approximated to that of a semiconductor chip.

Figure 6A:
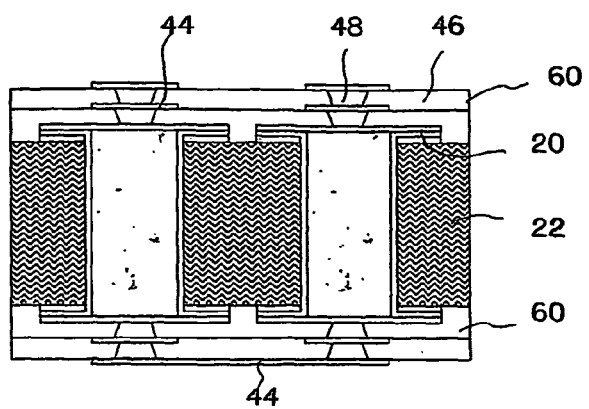
FIGS. 6A-D are explanation views of a step of assembling metal films, which have low thermal expansion coefficients, into the build-up layers.

In FIG. 6A, build-up layers 60 are formed on both side faces of a core substrate 22. Symbols 44 stand for wiring patterns; a symbol 46 stands for an insulating layer; and a symbol 48 stand for a via.

Figure 6B:
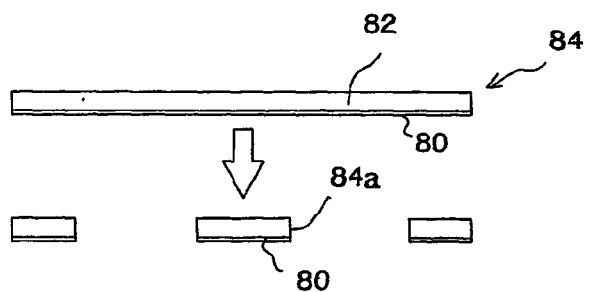

In FIG. 6B, an adhesive metal film 84, which is constituted by a metal film 80, e.g., metal alloy 42, whose thermal expansion coefficient is lower than that of copper, and an adhesive layer 82, and holes 84a are formed therein by proper means, e.g., drill, laser, etching. By forming the hole 84a, the adhesive metal film 84 does not interfere with the wiring the build-up layers 60 when the adhesive metal film is adhered onto the build-up layers 60.

Figure 6C:
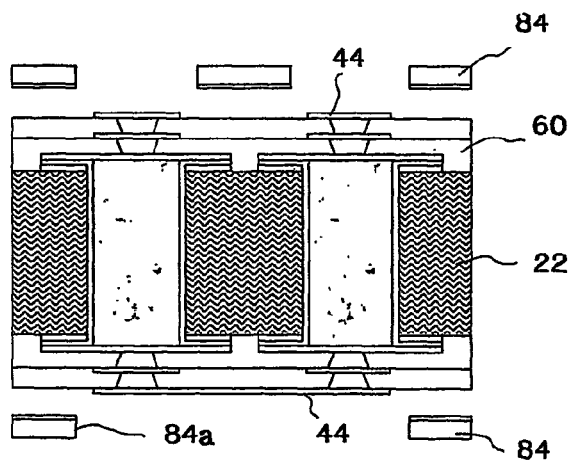
Figure 6D:
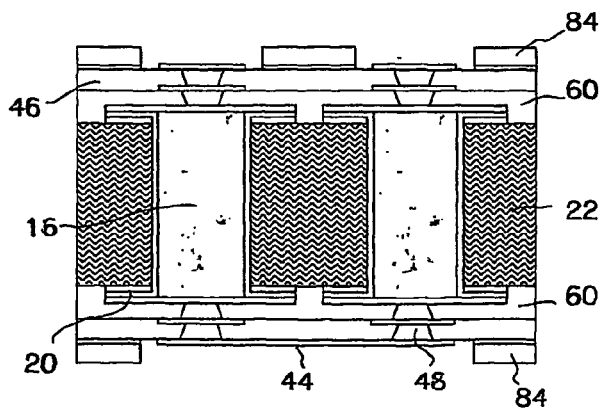

In FIG. 6C, the adhesive metal film 84 is correctly positioned with respect to the core substrate 22; in FIG. 6D, the adhesive metal film 84 is thermopressed onto the core substrate 22.

Figure 7A:
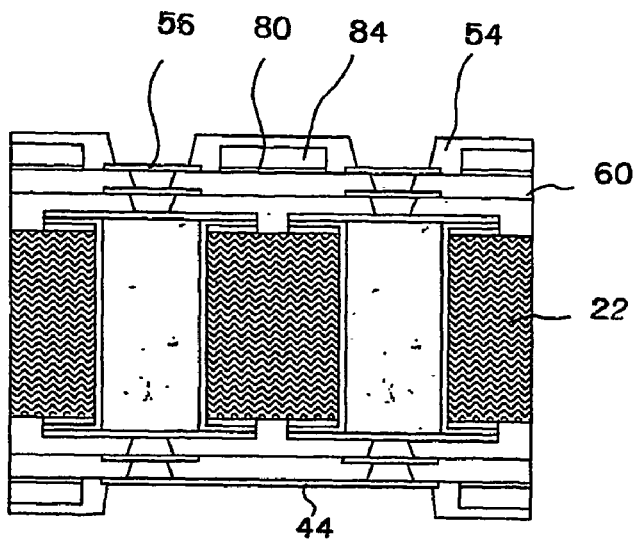
FIGS. 7A-C are explanation views of a step of producing a wiring board including the metal films.
Figure 7B:
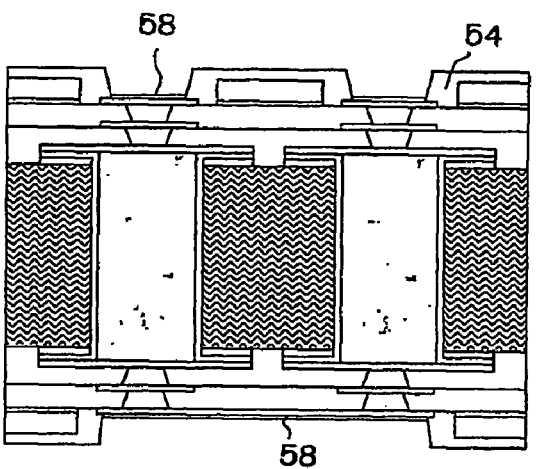
Figure 7C:
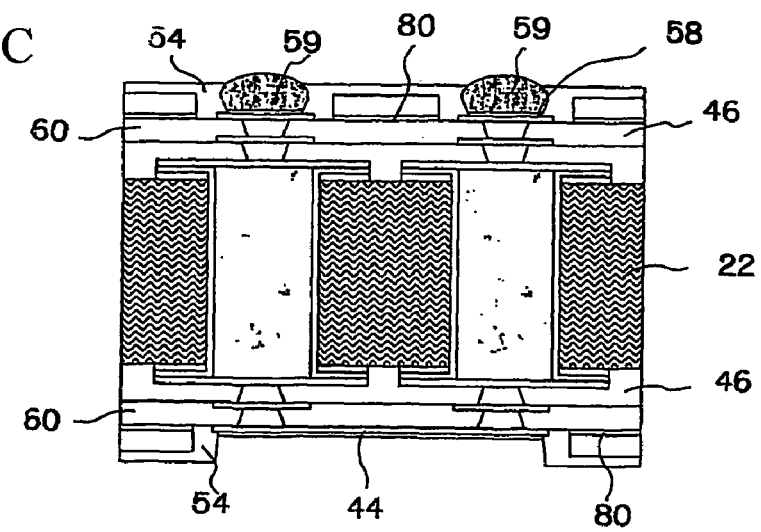

In FIG. 7A, photosensitive solder resist 54 is applied on the outer face of the build-up layers 60, exposed and developed, so that lands 56 are exposed. The metal film 80 is covered with the solder resist 54 and incorporated into the build-up layers 60. In FIG. 7B, the lands 56 and exposed parts of the wiring patterns 44 formed in the bottom face of the core substrate 22 are protected by plated layers 58. In FIG. 7C, solder bumps 59, which act as electrodes, are formed on the lands 56 by solder-printing and solder reflow.

In the present embodiment, the metal films 80, whose thermal expansion coefficients are low, are included in the build-up layers 60 formed on the both side faces of the core substrate 22, so that thermal expansion coefficients of the build-up layers 60 can be made lower and a thermal expansion coefficient of the wiring board can be approximated to that of the semiconductor chip. In the present embodiment, the metal films 80 having low thermal expansion coefficients are included in the outermost build-up layers 60. In case of including the metal film 80 in one build-up layer 60, preferably it is included in the outermost build-up layer 60.

FIGS. 8-10 show the steps of incorporating the metal films 80 having low thermal expansion coefficients into intermediate build-up layers 60.

Figure 8A:
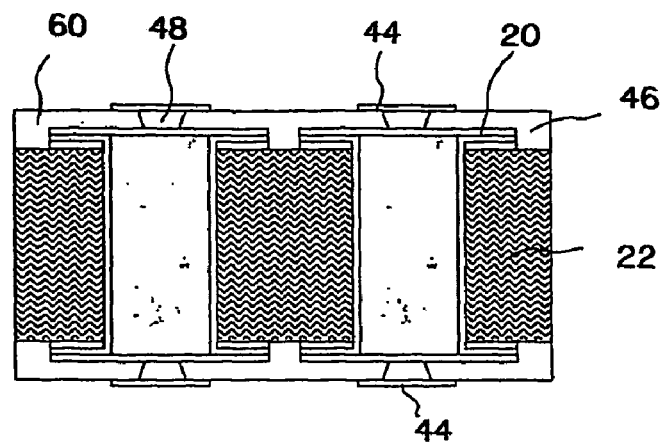
FIGS. 8A-C are explanation views showing another process of assembling the metal films into the build-up layers.
Figure 8B:
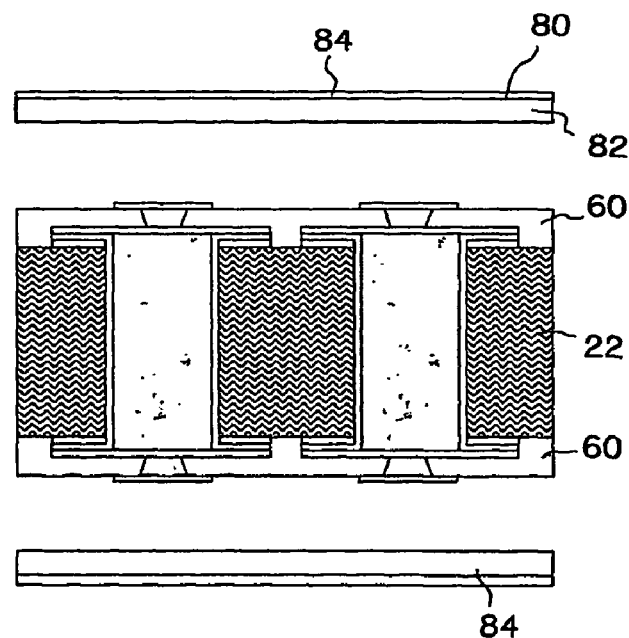
Figure 8C:
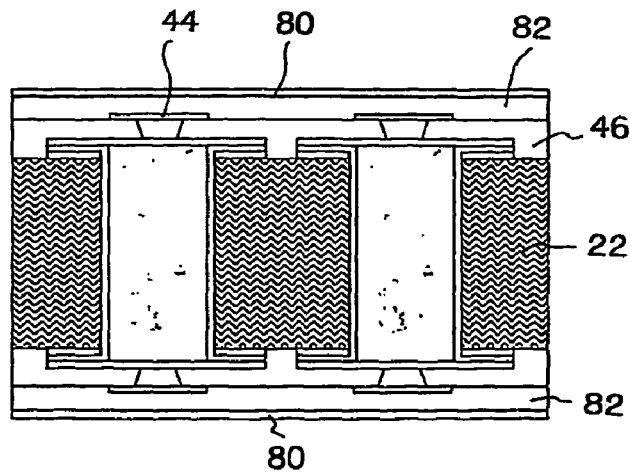

In FIG. 8A, the build-up layers 60, each of which is formed halfway, are formed on the both side faces of the core substrate 22. The adhesive metal films 84 including the metal films 80 are correctly positioned with respect to the build-up layers 60 formed on the both side faces of the core substrate 22 (FIG. 8B), then the adhesive metal films 84 are adhered onto the both sides of the core substrate 22 (FIG. 8C). The adhesive layers 60 are faced to the build-up layers 60 when the adhesive metal films 84 are adhered, so that the metal films 80 can be adhered by the adhesive layers 82.

Figure 9A:
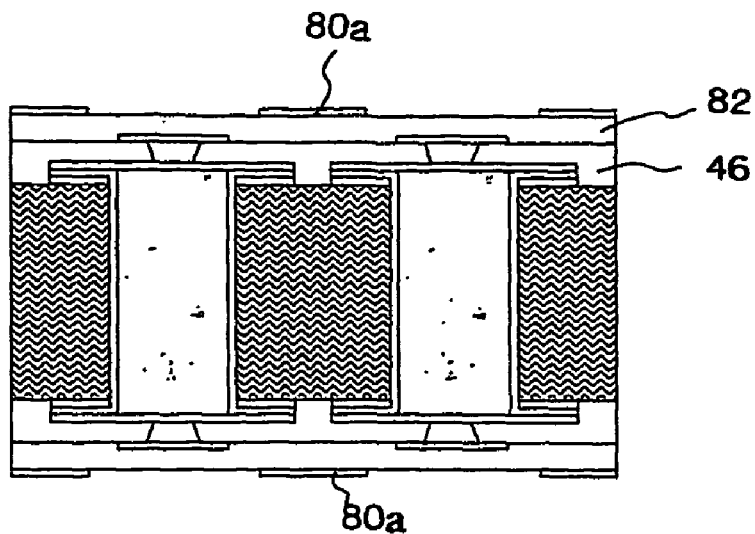
FIGS. 9A-C are explanation views of a step of forming the build-up layers including the metal films.
Figure 9B:
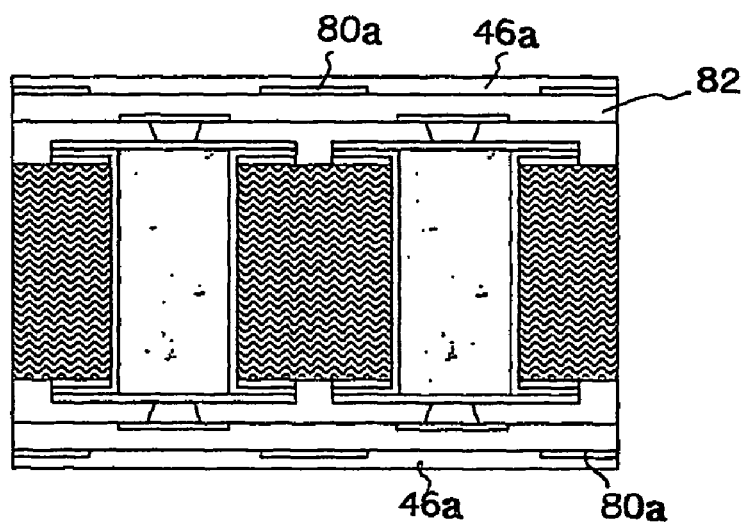
Figure 9C:
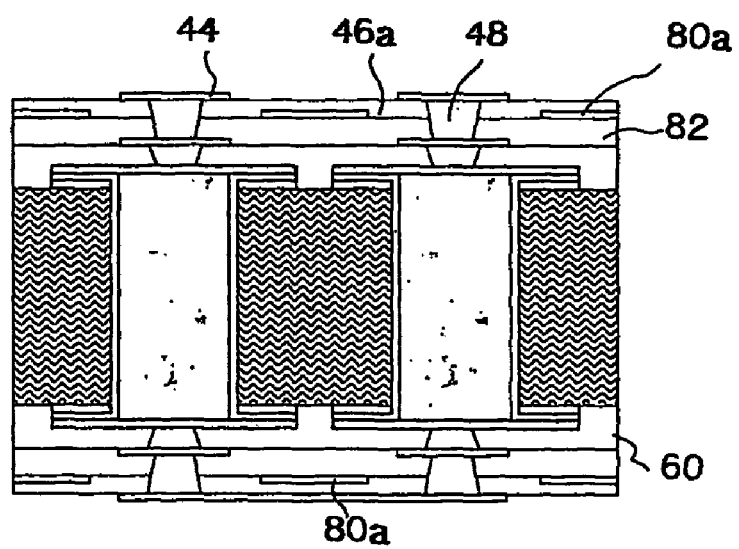

In FIG. 9A, the outermost metal films 80 are etched, by photolithography, to form into prescribed patterns. Symbols 80a stand for the patterned metal films. In FIG. 9b, the outermost layers including the metal films 80a are coated with insulating layers 46, which are made of insulating resin. To make the insulating layers 46 tightly contact the metal films 80a, surfaces of the metal films 80a may be roughened. In FIG. 9C, outer build-up layers 60 are respectively formed on the inner build-up layers 60 and electrically connected thereto by the built-up process. In this step, adhesive layers 82 and insulating layers 46a act as insulating layers between wiring layers. The metal layers 80a are formed into prescribed patterns so as not to interfere with the vias 48, which connect the wiring patterns 44 in different layers.

Figure 10A:
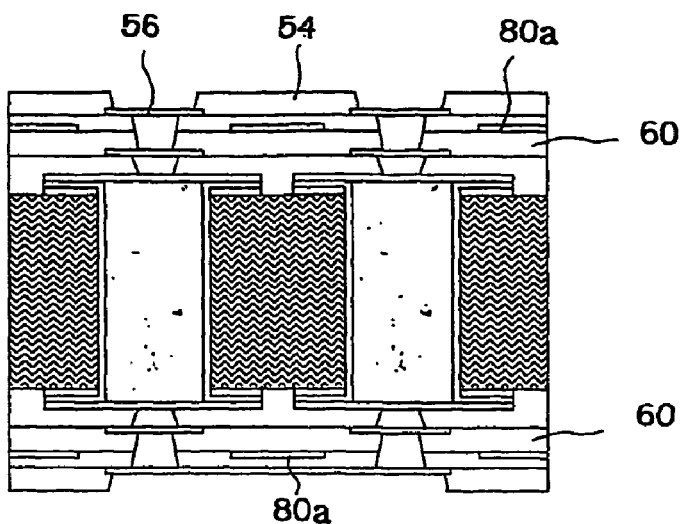
FIG. 10A-C are explanations views of a step of producing a wiring board including the metal films.
Figure 10B:
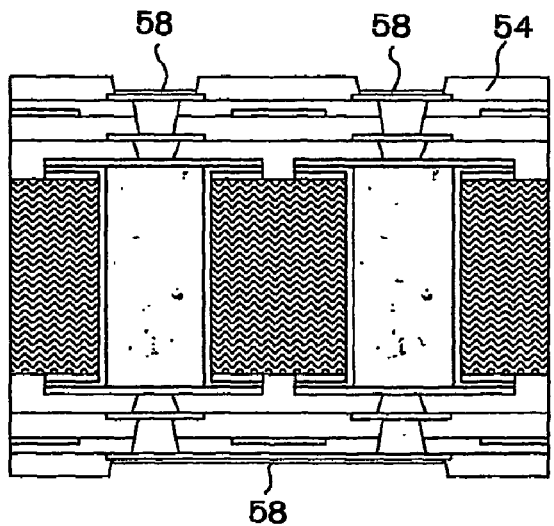
Figure 10C:
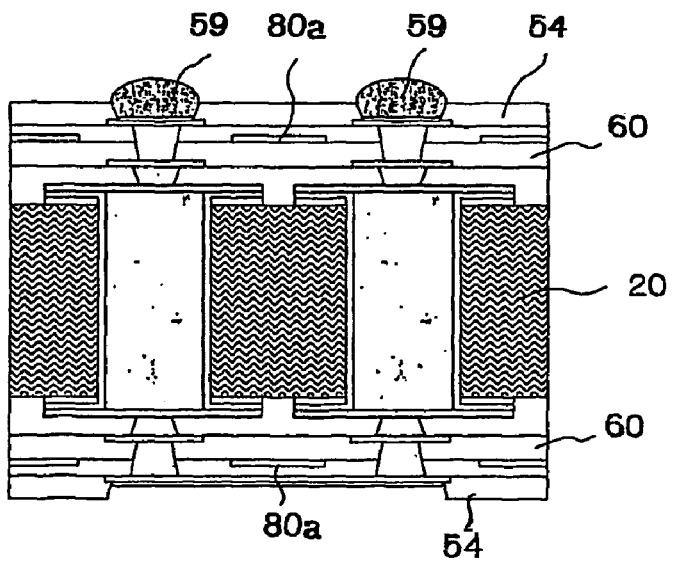
Figure 12A:
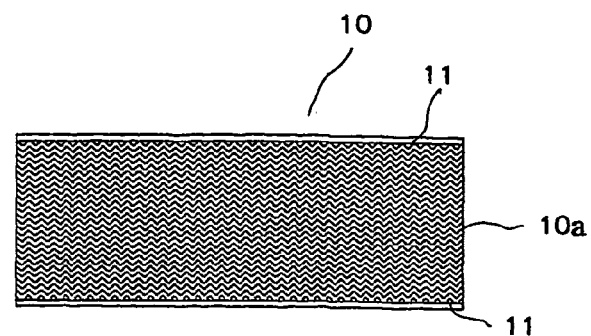
FIGS. 12A-F are explanation views of producing the conventional core substrate.
Figure 12B:
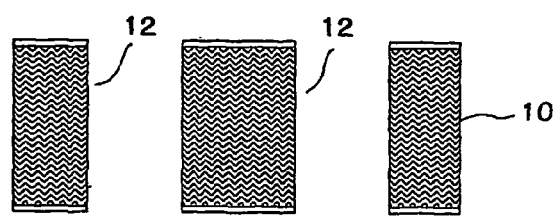
Figure 12C:
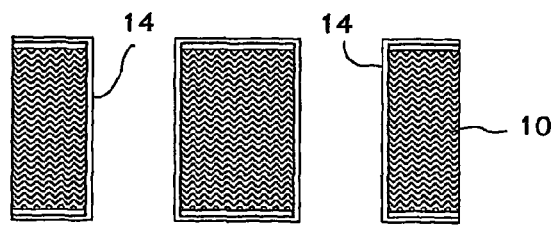
Figure 12D:
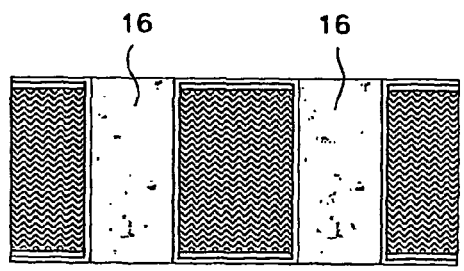
Figure 12E:
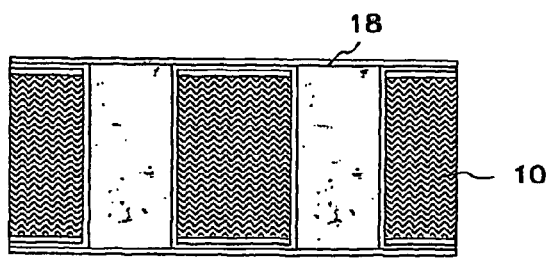
Figure 12F:
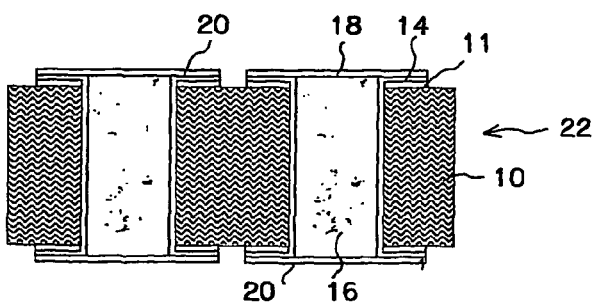
Figure 13A:
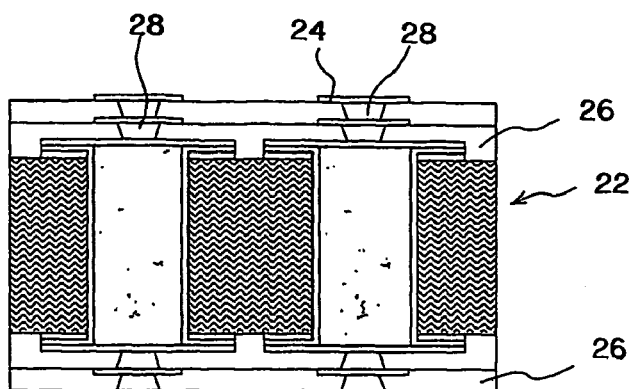
FIGS. 13A-D are explanation views of producing the conventional wiring board, in which the build-up layers are formed on the both sides of the core substrate.
Figure 13B:
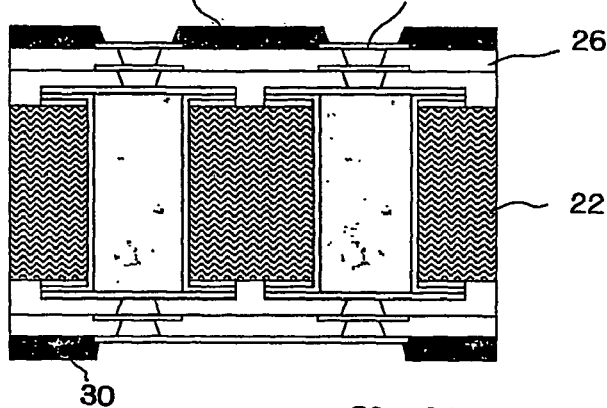
Figure 13C:
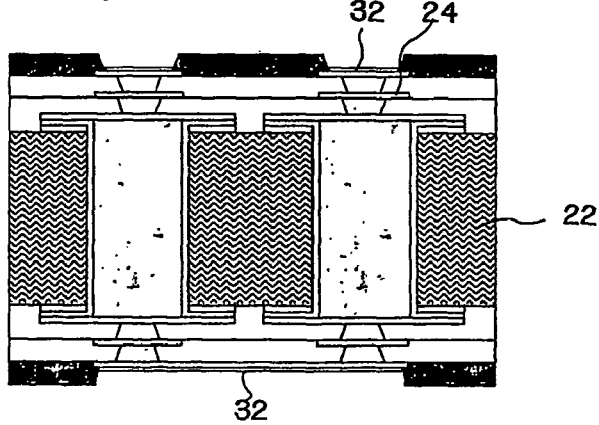
Figure 13D:
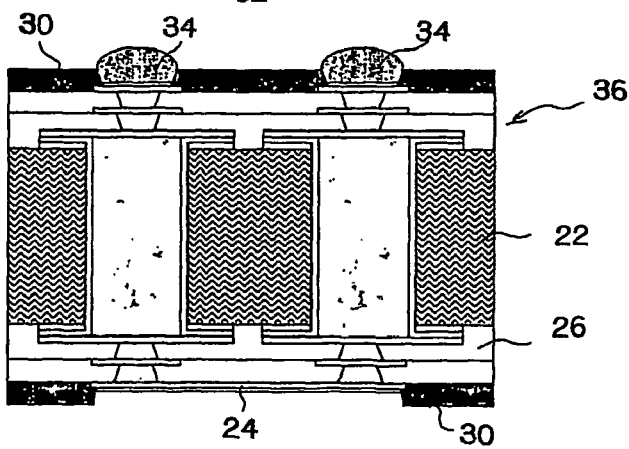

In FIG. 10A, photosensitive solder resist 54 is applied on the outer face of the build-up layers 60, exposed and developed so as to expose lands 56; in FIG. 10B, the lands 56 and exposed parts of the wiring patterns 44 are protected by plated layers 58; in FIG. 10C, solder bumps 59 are formed on the lands 56 by solder-printing and solder reflow.

By the method of the present embodiment, the wiring board, whose intermediate build-up layer 60 includes the metal film 80a having low thermal expansion coefficient, can be produced. By including the metal film 80a in the intermediate build-up layer 60, the thermal expansion coefficient of the wiring board can be approximated to that of the semiconductor chip. Note that, the metal films 80 may be included in a plurality of the build-up layers 60.

In the present embodiment, the metal films 80 having low thermal expansion coefficients can be incorporated in the built-up layers 60, by said methods similar to the build-up process, when the build-up layers are formed on the both side faces of the core substrate 22, and the step of incorporating the metal films 80 can be performed while forming the wiring patterns by the build-up process.

Figure 11:
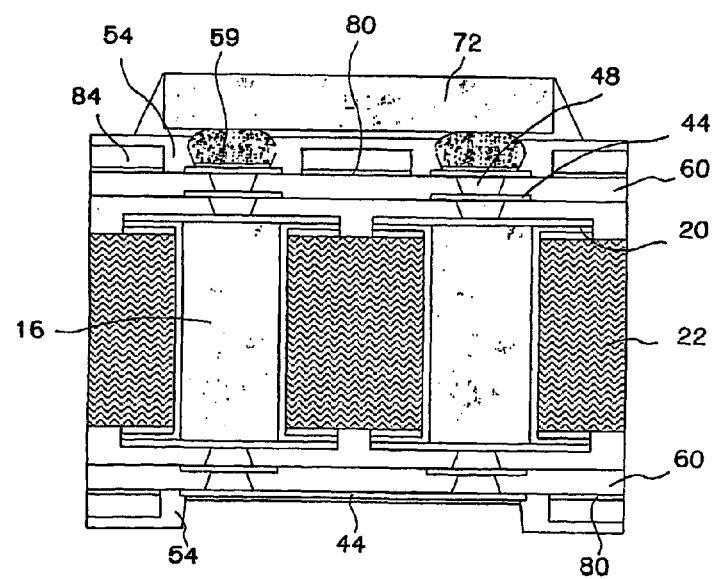
FIG. 11 is a sectional view of a semiconductor device, in which a semiconductor chip is mounted on the wiring board.

FIG. 11 shows a semiconductor device, in which the semiconductor chip 72 is mounted on the wiring board including the metal films 80 having the low thermal expansion coefficients. In the wiring board, the metal films 80 are included in the outermost build-up layers 60. By including the metal films 80 having the low thermal expansion coefficients, the thermal expansion coefficient of the wiring board can be approximated to that of the semiconductor chip, thermal stress between the semiconductor chip and the wiring board can be restrained, and the highly reliable semiconductor device can be produced.

The invention claimed is:

1. A method of manufacturing a wiring board comprising: a build-up layer, in which wiring patterns are piled with insulating layers; and a core substrate, which is separately formed from the build-up layer, said method comprising the steps of:
- separably forming the build-up layer on a plate-shaped support;
- electrically connecting the core substrate to the wiring patterns of the build-up layer on the support; and
- removing the support from the build-up layer so as to form the wiring board, in which the build-up layer is connected to the core substrate.

2. The method according to claim 1, wherein a metal layer is vacuum-sucked on the support, the build-up layer is formed on the metal layer, and the vacuum state between the metal layer and the support is broken after the core substrate is connected to the build-up layer so as to separate the said wiring board constituted by the build-up layer and the core substrate from the support together with the metal layer.

3. The method according to claim 1, wherein a first metal layer is adhered on the support, a second metal layer is vacuum-sucked on the support,
- the build-up layer is formed on the second metal layer, and
- the vacuum state between the first metal layer and the second metal layer is broken after the core substrate is connected to the build-up layer so as to separate said wiring board constituted by the build-up layer and the core substrate from the first metal layer together with the second metal layer.

4. The method according to claim 3, wherein the second metal layer is broader than the first metal layer, the second metal layer is vacuum-sucked on the support, an outer edge of the second metal layer is adhered to the support,
- the build-up layer is formed on the second metal layer,
- the core substrate is connected to the build-up layer so as to form a layered body, and
- the layered body is cut inside of the outer edge of the first metal layer, the vacuum state between the first metal layer and the second metal layer is broken so as to separate said wiring board constituted by the build-up layer and the core substrate from the first metal layer together with the second metal layer.

5. The method according to claim 1, wherein the core substrate is adhered to the build-up layer formed on the support by an adhesive film, which is an electric insulating film and has through-holes filled with an electric conductive material,
- whereby the core substrate and the build-up layer are electrically connected.

6. The method according to claim 1, wherein an element hole, in which a circuit element will be mounted, is formed in one side face of the core substrate, which is located on the opposite side of a semiconductor chip mounting position of the build-up layer.

* * * * *